United States Patent [19]
Frister

[11] Patent Number: 4,532,539
[45] Date of Patent: Jul. 30, 1985

[54] SOLID-STATE DIODE-RECTIFIER AND HEAT SINK STRUCTURE

[75] Inventor: Manfred Frister, Schwieberdingen, Fed. Rep. of Germany

[73] Assignee: Robert Bosch GmbH, Stuttgart, Fed. Rep. of Germany

[21] Appl. No.: 401,919

[22] Filed: Jul. 26, 1982

[30] Foreign Application Priority Data

Aug. 29, 1981 [DE] Fed. Rep. of Germany ....... 3134307
Nov. 21, 1981 [DE] Fed. Rep. of Germany ....... 3146227

[51] Int. Cl.³ .................... H01L 23/34; H01L 23/32; H01L 27/02
[52] U.S. Cl. ........................................ 357/81; 357/76; 357/77; 357/72
[58] Field of Search ................. 357/74, 72, 76, 77, 357/81; 174/16 HS, 52 PE, 52 H; 165/80 B

[56] References Cited

U.S. PATENT DOCUMENTS

| | | | |
|---|---|---|---|
| 2,917,286 | 12/1959 | Deakin | 165/80 B |
| 3,247,896 | 4/1966 | Chu et al. | 357/81 |
| 3,375,415 | 3/1968 | Finn, Jr. | 357/81 |
| 3,449,506 | 6/1969 | Weinstein et al. | 357/81 |
| 3,513,362 | 5/1970 | Yamamoto | 357/72 |
| 3,717,523 | 2/1973 | Dunsche | 357/79 |
| 3,743,895 | 7/1973 | Klunker et al. | 357/81 |
| 3,743,896 | 7/1973 | Weiske et al. | 357/79 |
| 3,793,570 | 2/1974 | Crouch et al. | 357/72 |
| 4,305,088 | 12/1981 | Narita et al. | 357/72 |

OTHER PUBLICATIONS

"Mounting Techniques for Press-Fit Rectifiers'—Joseph Lucas (Electrical) Ltd. Technical Publications Group—Electronic Components, Nov. 1970, pp. 1313–1318.
"Snap-On Heat Exchanger"—Mulligan—IBM Tech. Bulletin, vol. 10, No. 8, Jan 1968, p. 1242.

Primary Examiner—Andrew J. James
Assistant Examiner—Sheila V. Clark
Attorney, Agent, or Firm—Frishauf, Holtz, Goodman & Woodward

[57] ABSTRACT

A rectifier for association with an automotive alternator is made by providing a support plate (1) of aluminum on which a post (2) of aluminum is secured, for example by welding (FIG. 1) or by gripping a conical or bulged surface within the thickness of the plate (1) upon deformation of the plate after introducing the bulged or double-conical post into a hole in the plate; alternatively, the plate (1) which is of aluminum, can have a copper disk (23) secured thereto, nickel-plated all over, to which the semiconductor diode chip (4) is soldered. To securely retain a casting compound surrounding the diode chip, a sleeve (7) is placed around the chip, and the surface of the plate (1) is deformed to provide for reentrant claws (38), which mechanically grip the casting compound. The diode chip (4) is preferably secured to a copper-plated surface on the post (2), for example by soldering, the post as well as the plate then being made of aluminum for intimate contact with the plate and heat transfer from the diode thereto.

10 Claims, 5 Drawing Figures

SOLID-STATE DIODE-RECTIFIER AND HEAT SINK STRUCTURE

The present invention relates to a combination solid-state diode-rectifier and heat sink or cooling plate structure, and more particularly to such a structure suitable for use in combination with alternators, especially alternators designed for mobile application, such as, for example, alternators of the vehicular type. Such alternators provide alternating current, usually in three phases, which current is rectified and then provided to charge a floating battery of a d-c on-board independent power network, for example associated with an automotive vehicle.

BACKGROUND

Alternators for mobile use, particularly for installation in automotive vehicles, provides three-phase output current which is rectified by semiconductor diodes. The semiconductor diodes usually are constructed in form of diode plates, such as chips, which are secured to a base structure which must be so designed that it can carry away heat generated during operation of the diode.

It has previously been proposed to use cooling fins or cooling plates in combination with semiconductor rectifiers in form of sheet metal elements which are perpendicular to the axis of rotation of the generator. Usually, these cooling plates are sector-shaped—when viewed in axial direction with respect to the alternator—and bent over at their outer edge to form a flange or similar structure to increase the surface from which heat can be radiated. For high-power installations, housings are provided for the diodes which are cup-shaped or pot-shaped, the semiconductor chips being soldered to the bottom of the housing, and electrically connected at the outer side to a connecting head pin or wire. The space between the pin or wire and the diode is closed off by a casting compound. Such diodes then can be fitted into holes punched into the cooling plates which are installed in the alternator. During punching, the holes are so arranged that they have a projecting ring or burr or flange-like extension, which permits fitting the cup-shaped housings of the diodes by a press or interference fit.

THE INVENTION

It is an object to improve a diode rectifier—cooling element structure, particularly of a type suitable for association with a cooling or connecting plate of an alternator of the vehicular, for example automotive type, which permits better heat dissipation, and hence power utilization of the rectifier structure.

Briefly, a heat sink body is provided in form of an aluminum structure, to which the diode chip is secured, for example by soldering on an intermediate layer of copper plated on the end face of an aluminum post. The aluminum post can then be secured to the support plate, which forms part of the alternator rectifier structure, in various ways; in one form, the aluminum post can be connected thereto by friction or spin-welding; alternatively, the aluminum post can be formed with a projecting circumferential bead, for example in the shape of a double cone, which is seated in a suitably formed opening in the cooling and attachment plate to be associated with the alternator, which cooling and attachment plate is deformed to fit around the double cone of the aluminum post to hold the cone securely in position.

In accordance with a feature of the invention, the connection between the semiconductor diode substrate or plate or chip to the aluminum structure includes a copper plate which is nickel-plated and secured to the aluminum structure. The connection between the nickel-plated copper plate and the aluminum may be by welding, for example by ultrasonic welding. The terminal of the diode which is not connected to the aluminum post, e.g. at the side of the chip remote from the post, is connected to the alternator phase windings, for example, or to a connecting bus, by a connecting wire or lead which can be held in position by a casting compound surrounding the post and the connecting wire, and, before being cured or hardened, is retained in position by a surrounding sleeve. Preferably, the connecting wire may be formed with a loop or other deviation from a straight line, to insure tight and secure retention within the casting compound. The casting compound can additionally be mechanically attached to the support and cooling plate by deforming the support and cooling plate to form projecting ridges, claws, beads, or the like, extending within the casting compound and securely holding it in place after it has set or cured.

DRAWINGS

Figure 1:
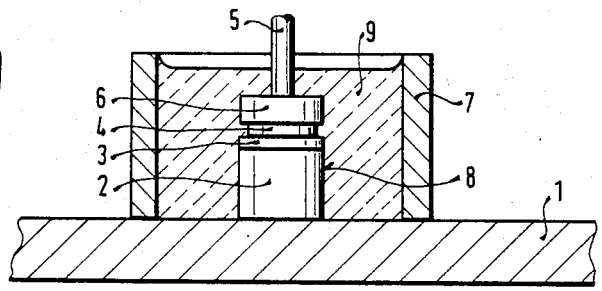
FIG. 1 is a longitudinal axial view through a semiconductor diode structure applied to the attachment and cooling plate of an automotive-type alternator.

A cooling and attachment or support plate 1 (FIG. 1), for example of sheet aluminum, is provided to hold the diodes in position. The thickness of the plate 1 is exaggerated in the drawings, for ease of illustration and visualization of the invention. The diode, together with its heat sink body 2, is secured to the plate 1 by friction or spin-welding. The heat sink body 2 is made of aluminum, and constructed in form of a cylindrical post. Before being attached to the plate 1, it is formed with a layer 3 of copper thereon. The layer 3 of copper may be formed in various ways, for example by copper-plating or by attaching a copper disk thereto. In the embodiment of FIG. 1, a layer 3 is plated on the post 2. The thickness of the layer 3, in FIG. 1, is exaggerated for visibility.

A silicon diode chip 4 is soldered on the copper layer 3. The silicon diode has a pn junction extending parallel to the end faces, and not further shown in the drawing, in accordance with well known diode technology. The other side of the diode chip 4 is soldered to a connecting wire 5. The head of the connecting wire 5 is enlarged, by upsetting, to form an enlarged head 6 in order to improve the contact area of the wire 5 with the silicon chip 4.

The post 2, welded to the plate 1, together with the chip 3 and the connecting wire 5 thereon are protected against mechanical damage, effects of moisture and the like, by surrounding the assembly by a tubular sleeve 7, preferably concentrically arranged with respect to the post 2 and the wire 5, and pouring an insulating casting compound 9 in the space within the sleeve 7 which, upon curing or hardening, securely retains the semiconductor diode assembly, and prevents mechanical or other environmental damage thereto.

Figure 2:
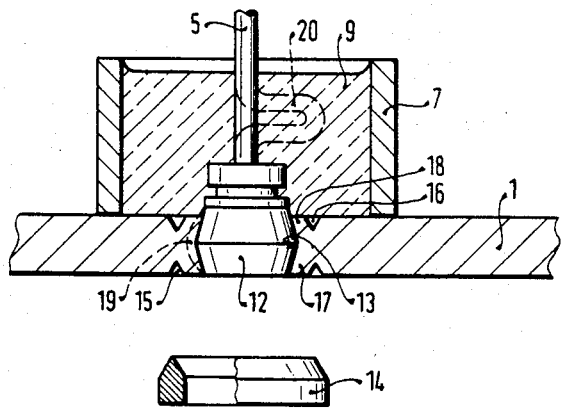
FIG. 2 is a view similar to FIG. 1, showing a modified arrangement, and a tool to seat the diode structure in the cooling plate.

Embodiment of FIG. 2; The same reference numerals have been used as in FIG. 1. In accordance with the embodiment of FIG. 1, the post 2 has a cylindrical external surface 8. In FIG. 2, in contrast, the circumferential surface of the post 2' is double-conical, which can be obtained by upsetting a cylindrical element or deforming a cylindrical aluminum element; material-removal work, such as forming the double cone 12 on a screw machine, is not necessary. The double-conical shape is so arranged that the circumference decreases towards the planar end faces or surfaces of the post 2. This double-conical arrangement easily insures connection with the cooling and attachment sheet 1 by forming an interlocking fit therewith. In accordance with FIG. 2, a cylindrical bore 13 is first formed in the plate 1, and then the post 12, in the double-conical form shown, is fitted in the hole 13. Upon seating within the hole, a cylindrical punch 14 is pressed, from both sides, against the plate to form notches 15 which will deform the region of the plate 1 surrounding the hole 13 to provide ring grooves 15, 16 at the bottom and top of the plate 1 and, upon such deformation, form bead-like rings 17, 18 which grip of clamp the double cone post 12 in position. The arrangement provides not only for reliable secure attachment, but also for a substantial transition and heat transfer surface between the post 12 and the surrounding surface of the plate 1.

FIG. 2 illustrates only one of the punch elements 14 for clarity; a similar element is moved to form the ring groove 16 from above.

Various other shapes may be used, and, for example, it is not necessary that the post 12 have a double-conical form. For example, a portion of the double cone may be rounded, for example by forming a circular bead along its circumference as illustrated by the broken lines 19; this bead may extend only over a portion of the circumference, and thus is shown only in broken lines. Other arrangements to provide for an interengaging, interlocking fit by a projection-and-recess arrangement than double cones or beads may be used; for example, the outer surface of the post 12 may be part-spherical, or otherwise provide for a projecting zone, obtained by deforming a cylindrical post element, for example similar to element 2 (FIG. 1), by compression, upsetting, or the like, within a die.

FIG. 2 also shows, in broken lines, deformation of the connecting wire 5 to form a loop 20. Loop 20 is formed before the casting compound 9 has cured and improves interconnection of the insulating casting compound 9 with the structure as well as with the connecting wire 5.

Figure 3:
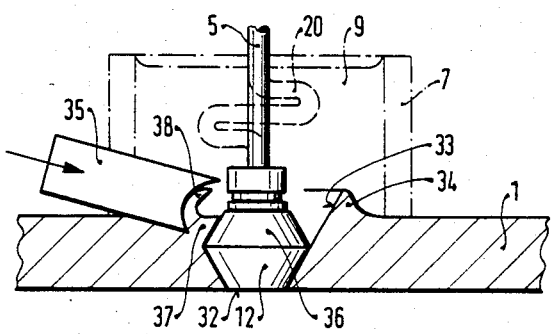
FIG. 3 is a part-sectional, part-pictorial side view of a diode structure seated in a cooling plate during placement and before the attachment is securely finished.

The embodiment of FIG. 3 has a post 12 which also has a double-cone circumferential surface. The cones can be reversely positioned. To mount the rectifier diode unit in accordance with FIG. 3, a hole of the diameter corresponding to the lower or bottom end face surface of the post 12 is punched from the sheet 1. The diameter of the hole, thus, will correspond to the diameter of surface 32. A punch or similar tool with a conical head is then introduced so that the hole will be conically enlarged at the upper side to have the surface 33. This wil result in a projecting bead 34 being formed at the top surface of the sheet 1. A material-removal tool, for example in form of an excavating punch 35, is then engaged with the sheet 1—which is suitably backed up by a back-up support or anvil, not shown—to press the material of the sheet 1 against the upper conical surface 36 and, at the same time, form an upstanding projecting ridge or bead, in claw-shaped configuration as illustrated at 38 in FIG. 3. The double-conical surface of the post 12 thus will be held securely within the sheet 1 by an upper holding or clamping portion 37 which will form therein upon introduction of the punch 35. Punch 35 is illustrated schematically, and may be in form of several circumferentially positioned punch elements which engage around the post 12. FIG. 3 illustrates, at the right side, the opening within which the post 12 is seated, and surface 33, before deformation; at the left side, the opening, closed by portion 37 against the post 12, and deformed to form the claw 38, is illustrated. Claw 38 is used to improve adhesion of the casting compound 9 to be introduced after the post has been set. The surrounding sleeve 7 and casting compound 9 have been shown only in phantom representation in FIG. 3. The claw 38 is peeled from the upper surface of the cooling plate 1. After the post is seated, the casting compound can be introduced as described above.

The adhesion between the insulating casting compound 9 and the diode wire 5 can be further improved by deforming the wire 5 in form of a spiral, a double loop, or the like; FIG. 3 illustrates deformation of the wire 5 in form of a double bend 20.

Figure 4:
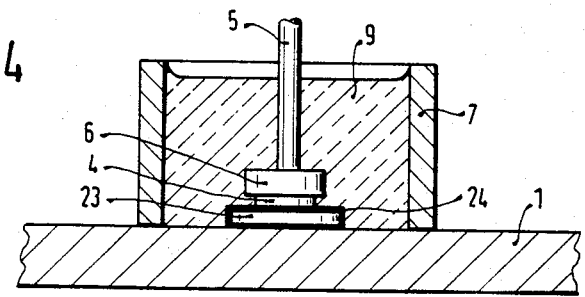
FIG. 4 shows another embodiment of the semiconductor rectifier-cooling and attachment plate arrangement, in longitudinal sectional section.
Figure 5:
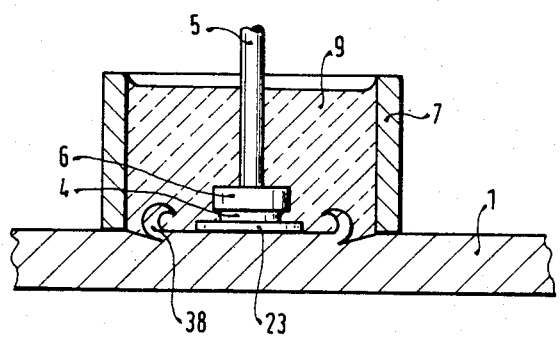
FIG. 5 illustrates another embodiment, in longitudinal section, similar to the illustration of FIG. 4.

The post 2, in the embodiment described, is comparatively thick. The surface adjacent the semiconductor chip 4 has a copper layer 3 applied thereto which, in FIGS. 1-3, is shown to a greatly enlarged scale. Low transition resistances, and particularly low heat flow resistance, can also be obtained by forming the copper layer of greater thickness. FIGS. 4 and 5 illustrate a copper plate 23, punched from a sheet of copper, which has a nickel plating surrounding the copper at all sides. Nickel plating 24 completely surrounds the copper disk 23. The silicon semiconductor chip 4 is secured to the nickel layer 24 on the copper disk 23 in customary and suitable manner. The copper plate 23, together with the chip 4, is then soldered to the aluminum cooling and support plate 1. Ultrasonic bonding or soldering or welding is particularly suitable.

A tubular sleeve 7 is provided to surround the copper disk 23, the chip 4, and the head 6 thereon, and provide a holding sleeve for a casting compound 9, which protects the diode against environmental or mechanical damage.

To improve adhesion of the casting compound 9, the plate 1 can be deformed by peeling claws 38 therefrom in the region surrounding the welding or bonding point of the copper disk 23, with the nickel plating or coating 24 thereon. These claws can be made similar to the mode described in connection with FIG. 3 by peeling out of the top surface of the cooling plate 1, located immediately adjacent the disk 23. The claws increase the mechanical adhesion of the insulating casting compound 9 upon curing and hardening, and after having been introduced thereinto when in flowable condition.

The structures have the advantage that heat transfer between the semiconductor 4 and the cooling plate 1 is highly effective so that, in comparison to previously used diodes, a higher current density can be obtained within the rectifier, so that, given the same size semiconductor chip, and similar external dimensions, greater power output can be obtained from the rectifier.

Various changes and modifications may be made, and features described in connection with any one of the embodiments may be used with any one of the others, within the scope of the inventive concept.

I claim:

1. Solid-state diode-rectifier and heat sink or cooling plate structure, particularly for combination with a mobile-type alternator, to supply direct current power to a self-contained d-c network, having a chip (4) of semiconductor material and a heat sink body, wherein, in accordance with the invention, the heat sink body comprises an aluminum support or attachment plate (1) secured to an aluminum post (2) and the side of the chip (4), which is to be subjected to cooling, is secured to at least one of the plate (1) and the post (2), the aluminum support or attachment plate (1) is formed with an opening (13); and said aluminum post (2) has, at least in part, a double-conical surface portion (12) to provide an outer circumferential surface of varying diameter, said portion (12) being fitted in said opening, and the support or attachment plate (1) having engaging portions fitting around the post in the region of said portion of varying diameter to provide an interlocking engaging fit between the plate (1) and the post (2).

2. Structure according to claim 1, wherein the outer circumference of said portion of varying diameter is externally projecting in the form of a bulge or double-conical surface (13, 19, 36), and the surface of said post facing the chip (4) has a diameter which is less than the maximum diameter of said bulging or double-conical surface.

3. Structure according to claim 1, further comprising a copper disk (23) secured to said plate (1), the semiconductor chip (4) being attached to said copper disk.

4. Structure according to claim 3, wherein said copper disk (23) is nickel-plated, and the semiconductor chip (4) is secured to the copper disk by soldering on a nickel-plated surface thereof.

5. Structure according to claim 3, wherein said copper disk (23) is secured to the aluminum plate (1) by welding.

6. Structure according to claim 4, wherein said nickel-plated copper disk is secured to the aluminum plate (1) by an ultrasonic weld.

7. Structure according to claim 1 or 3, further including a sleeve (7) surrounding the semiconductor chip, with clearance, and extending away from said support or attachment plate (1) beyond the outline of said semiconductor chip;

a casting compound (9) filling the space between said sleeve and the semiconductor chip;

and engagement claws (38) projecting from said plate (1) into said casting compound (9) and sheared out from the surface of the attachment and support plate (1) in a zone between the semiconductor chip and said sleeve.

8. Method of making a comination solid-state diode rectifier and heat sink or cooling structure, particularly for combination with a mobile-type alternator to supply direct current power to self-contained d-c network, said structure having:

a support or attachment plate (1);

a cylindrical heat sink cooling and support element (2,23), incluedig a circular structure (12) having a bulged or double-conical outer surface, secured to said support plate (1) and a chip (4) of semiconductor material secured to said support element (2,23);

a connecting lead (5) extending from the chip (4) at a surface opposite from the chip surface attached to the support element (2,23);

a sleeve (7) surrounding the chip (4) and seated against said support or attachment plate (1); and a casting compound (9) filling the space between said sleeve (7) and the support element (1), the chip (4) and the connecting lead (5), comprising in accordance with the invention, the steps of forming an opening in the support or attachment plate receiving said support post element (2,23);

deforming the region of the support or attachment plate to flow around the bulged or double-conical outer surface and to thereby grip said support post, and lock the support post, irremovably, in the opening, shearing-out, from a surface of the support or attachment plate in the region between the support element (2) and the sleeve (7), a projecting claw (38) having a re-entrant portion, to form a projecting gripping claw, before intoducing the casting compound (9) in liquid form in the space within the sleeve (7), and permitting the casting compound (9) to harden or cure, whereby the re-entrant portion of the projecting claw (38) will mechanically grip the casting compound, and prevent loosening from the surface of the support or attachment plate (1).

9. Method according to claim 8, wherein said surface shearing and said plate deformation steps are carried out in one operation by at least one shearing tool (35) deforming the material of said support or attachment plate (1) surrounding the bulged or double-conical region (12) of said post (2), while simultaneously shearing out said projecting claw (38).

10. Method according to claim 8, wherein said plate deformation step is carried out by pressing cylindrical punches (14), concentrically with said opening (13), simultaneously against both sides of said plate (1) to form bead-like rings (17,18) which clamp the double-conical surface (12) of the support post (2) in position.

* * * * *